United States Patent
Bae

[11] Patent Number: 5,870,201
[45] Date of Patent: Feb. 9, 1999

[54] MAGNIFICATION MEASURING MARK

[75] Inventor: Sang Man Bae, Kyoungki-do, Rep. of Korea

[73] Assignee: Hyundai Electronics Industries Co., Ltd., Kyoungki-do, Rep. of Korea

[21] Appl. No.: 880,367

[22] Filed: Jun. 23, 1997

[30] Foreign Application Priority Data

Jun. 24, 1996 [KR] Rep. of Korea .................. 1996-23250

[51] Int. Cl.[6] .................................................. G01B 11/00
[52] U.S. Cl. ........................... 356/401; 356/400; 250/548
[58] Field of Search .................... 356/363, 400, 356/401, 399; 327/162; 250/548

[56] References Cited

U.S. PATENT DOCUMENTS 4,664,527 5/1987 Hattori et al. ......................... 356/401
5,414,519 5/1995 Han ....................................... 356/401
5,529,595 6/1996 Ueki et al. ............................ 356/401

Primary Examiner—Robert Kim
Attorney, Agent, or Firm—Gary M. Nath; Harold L. Novick; Nath & Associates

[57] ABSTRACT

A magnification measuring mark for measuring magnification compensation and correction values of multilayer patterns to be formed for a semiconductor device. The magnification measuring mark includes an inner box and a pair of measuring patterns respectively arranged on the left and right of the inner box or above and below the inner box. The measuring patterns are adapted to measure a pattern misalignment in X and Y axes. One of the measuring patterns is set as a reference measuring pattern for measuring a magnification of the other pattern not set as the reference measuring pattern.

6 Claims, 4 Drawing Sheets

MAGNIFICATION MEASURING MARK

BACKGROUND OF THE INVENTION

1. Field of the Invention

The present invention relates to a magnification measuring mark for semiconductor devices, and more particularly to a magnification measuring mark adapted to measure the magnification of a pattern which is transferred to a wafer by use of a stepper in the fabrication of DRAM's, SRAM's or LCD's.

2. Description of the Prior Art

In the fabrication of semiconductor devices, pattern overlap measuring marks are widely used to measure the overlay of a pattern mask layer disposed over another pattern mask layer.

Factors used to measure a pattern overlay include a misalignment value between two overlaying pattern layers, a pattern magnification value and a pattern rotation value.

Overlay measuring marks are mainly adapted to measure a misalignment value, thereby correcting a pattern overlay. It is very complex to calculate pattern magnification and rotation values. Moreover, it is impossible to know data used in the process of calculating those pattern magnification and rotation values.

For this reason, it is difficult for persons engaged in the fabrication of semiconductor devices to accurately know magnification values of all patterns formed in the fabrication of semiconductor devices.

SUMMARY OF THE INVENTION

Therefore, an object of the invention is to provide a magnification measuring mark capable of easily measuring a pattern magnification which is particularly important in the fabrication of patterns for next-generation semiconductor devices such as 1 GDRAM's or 256 DRAM's.

In accordance with the present invention, this object is accomplished by providing a magnification measuring mark structure for a semiconductor device including magnification measuring marks respectively arranged on scribe lines adjacent to the center of a die, each of the magnification measuring marks comprising: an inner box arranged on each of four corner portions of the die where the scribe lines are disposed, respectively; a first pattern arranged on each of the die corner portions in such a manner that it is disposed on the left or right of an associated one of the inner box, above the associated inner box or below the associated inner box, the first pattern being adapted to measure a misalignment in X and Y axes with reference to the inner box; a second pattern arranged on each of the die corner portions in a region, where the first pattern is not disposed, in such a manner that it is disposed on the left or right of an associated one of the inner box, above the associated inner box or below the associated inner box, the first pattern being adapted to measure a misalignment in X and Y axes with reference to the inner box; and the first and second patterns being arranged in such a manner that they are symmetrical in X and Y axes along with those of other magnification measuring marks with respect to X and Y-axis center lines of the die, whereby one of the first and second patterns can be set as a reference pattern for measuring a magnification of the other pattern not set as the reference pattern.

The measurement of the misalignment in X and Y axes using the first and second patterns is achieved by measuring distances from the inner box of each magnification measuring mark to the associated first and second patterns using a measuring device, respectively.

The X and Y-axis magnifications are derived by the following equation when the first pattern is set as a reference pattern:

$$M2 = X1 - \delta/k(A+B+C+D)$$

where, "A", "B", "C" and "D" represent design values which correspond to distances from the center of the die to respective positions of the magnification measuring marks, respectively, "M1" represents a magnification of the first pattern which is typically defined as "1", "M2" represents a magnification of the second pattern, and "δ" represents the sum of X or Y-axis misalignment values at respective positions of the magnification measuring marks.

In accordance with the present invention, it is necessary to provide one inner box as an absolute reference mark to observe a variation in pattern magnification between at least two relative patterns, and two different patterns, namely, the first and second patterns, to measure a relative pattern magnification.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
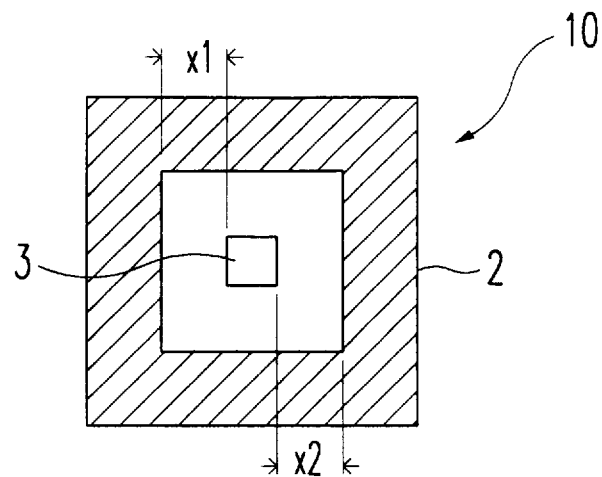
FIG. 1 is a plan view illustrating a conventional box-in-box type overlay measuring mark.

FIG. 1 illustrates a conventional overlay measuring mark. As shown in FIG. 1, the overlay measuring mark, which is denoted by the reference numeral 10, has a box-in-box structure. That is, the overlay measuring mark 10 has an outer box 2 and an inner box 3. The overlay measuring mark 10 is adapted to measure X and Y-axis misalignment values between the outer and inner boxes 2 and 3. The X-axis misalignment value δ is defined as "δ=x1−x2".

Generally, the outer box 2 of the measuring mark 10 has an outer size of 70×70 $\mu m^2$ which is defined by the outer edges of the outer box 2. The outer box 2 of the measuring mark 10 also has an inner size of 20×20 $\mu m^2$ which is defined by the inner edges of the outer box 2. The inner box 3, which is subsequently formed after the formation of the outer box 2, has a size of 10×10 $\mu m^2$.

Figure 2:
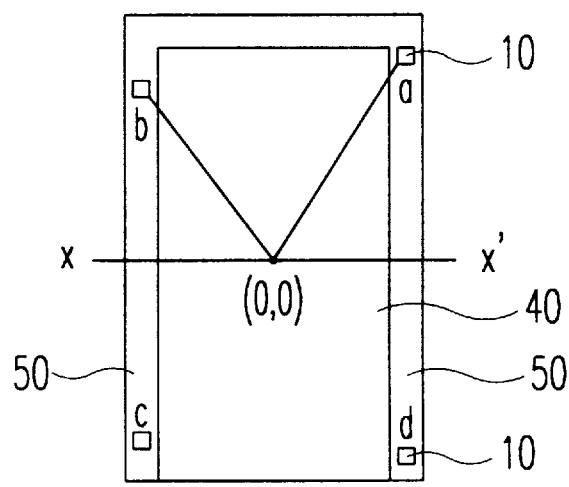
FIG. 2 is a plan view illustrating the case in which the box-in-box type measuring mark of FIG. 1 is formed on each corner portion of a die.

FIG. 2 shows the case in which the box-in-box type measuring mark 10 is formed on a scribe region 50 defined at each corner portion of a die 40. In the illustrated case, four measuring marks 10 are formed at positions a, b, c and d, respectively. X and Y-axis misalignment values between two layers 2 and 3 of each measuring mark 10 are analyzed, thereby calculating offset, magnification and rotation values. The pattern misalignment values and an average value thereof are easily calculated because they are primary measuring values. However, the magnification and rotation values are derived only by comparing the misalignment values, obtained from the four measuring marks respectively disposed at the corner portions of the die, with one another, and performing a conversion of the comparison results several times.

Figure 3:
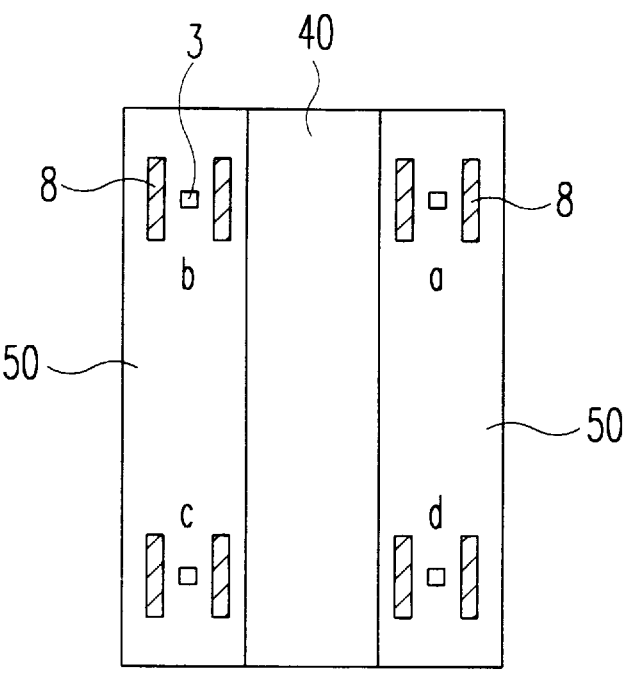
FIG. 3 is a plan view illustrating another conventional measuring mark used to measure X and Y-axis offset values.

FIG. 3 illustrated another conventional measuring mark used to measure X and Y-axis offset values. As shown in FIG. 3, this measuring mark has an inner box 3 similar to that of FIG. 2 and a pair of parallel straight line patterns 8 arranged on both sides of the inner box 3 and adapted to measure an X-axis offset value. These straight line patterns 8 are comprised of the same material layer. The X-axis misalignment value can be easily measure by measuring the distance from each pattern 8 to the inner box 3.

Although the measuring mark shown in FIG. 3 easily measures misalignment values, it is impossible to measure magnification values using such a measuring mark.

On the other hand, the present invention provides a measuring mark having a structure capable of obtaining data about magnification values even for a misaligned pattern.

Figure 4:
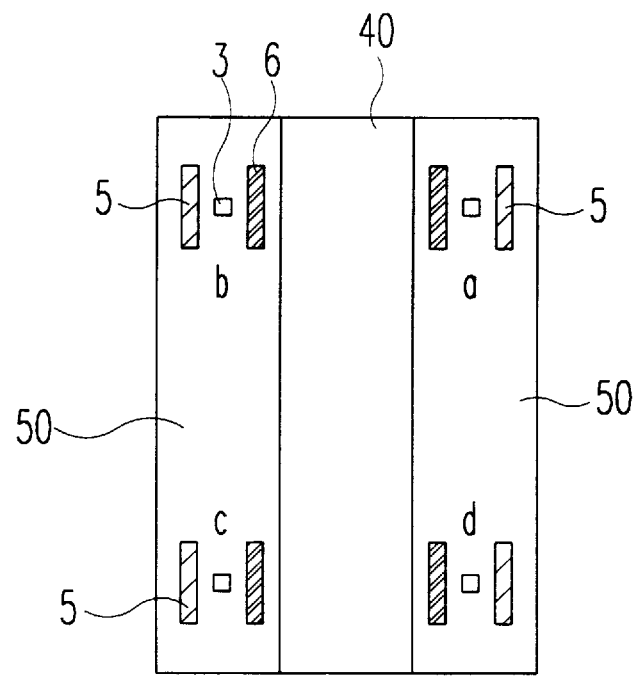
FIG. 4 is a plan view illustrating a magnification measuring mark according to an embodiment of the present invention in which first and second patterns are arranged in a symmetrical manner with respect to an inner box.

FIG. 4 is a plan view illustrating a magnification measuring mark according to an embodiment of the present invention. As shown in FIG. 4, the magnification measuring mark has an inner box 3 and a pair of parallel straight line patterns 5 and 6 arranged on both sides of the inner box 3 while being laterally spaced from the inner box 3 by the same distance (about 10 $\mu$m), respectively. These straight line patterns 8 are comprised of different material layers, respectively. The measuring mark is formed on each of four corner portions a, b, c and d of a die 40. The first and second patterns 5 and 6 of four measuring marks are appropriately arranged on the die 40 so as to obtain an arrangement which is symmetrical in X and Y axes with respect to both the X and Y-axis center lines of the die 40.

That is, the first pattern 5 at the die corner portion a is arranged on the left of the associated inner box 3 whereas the associated second pattern 6 is arranged on the right of the associated inner box 3. On the other hand, the first pattern 5 at the die corner portion b is arranged on the right of the associated inner box 3 whereas the associated second pattern 6 is arranged on the left of the associated inner box 3. The arrangement of the first and second patterns 5 and 6 at the die corner portions c and d is the same as that at the die corner portions a and b. Thus, the arrangement of the first and second patterns 5 and 6 on the die is symmetrical in X and Y axes.

For instance, the first patterns 5 are patterns comprised of an oxide film formed on a scribe line upon forming an element isolating film on the die whereas the second patterns 6 are patterns comprised of a photoresist film used to form a gate electrode pattern on the scribe line upon forming a gate electrode on the die.

Figure 5:
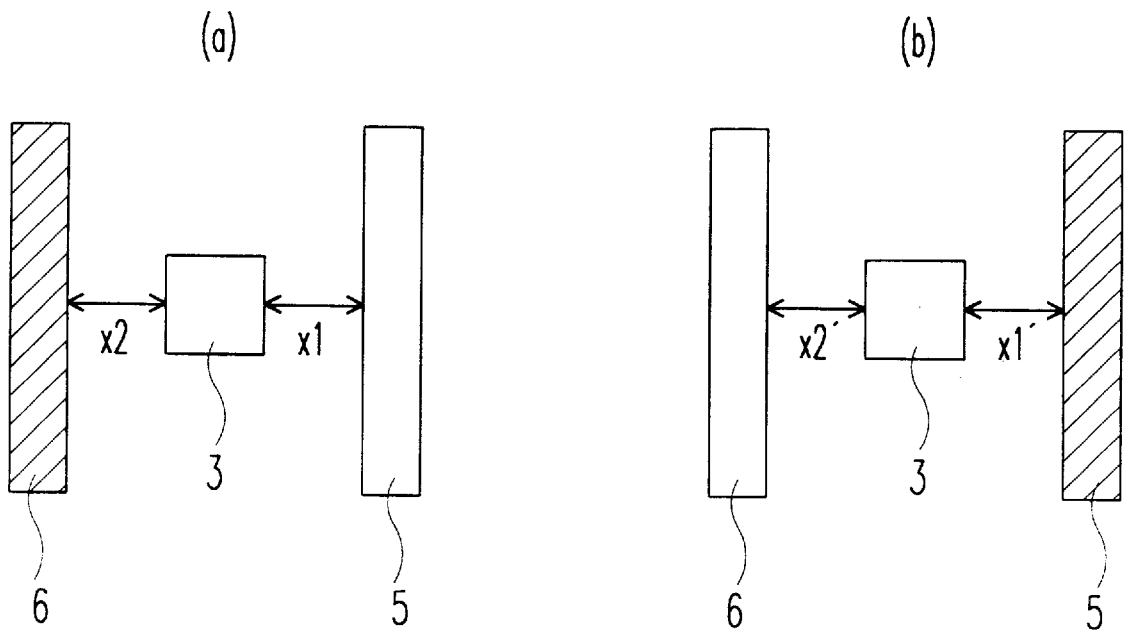
FIGS. 5a and 5b are enlarged views respectively illustrating distances from the inner box used as an alignment key to the first and second patterns on the die corner portions a and b shown in FIG. 4.

FIGS. 5a and 5b are views respectively illustrating a X-axis magnification measurement using the measuring marks formed on the die corner portions a and b. In this measurement, each inner box 3 is used as an alignment key.

When it is assumed that "r" represents an X-axis misalignment value between the first and second patterns 5 and 6 from the inner box 3, and "x1" and "x2" represent respective distances from the first and second patterns 5 and 6 on the die corner portion a to the associated inner box 3, and "x1'" and "x2'" represent respective distances from the first and second patterns 5 and 6 on the die corner portion b to the associated inner box 3, respective misalignment values of the inner boxes 3 on the die corner portions a and b with respect to the associated first and second patterns 5 and 6 are calculated by the following equations:

On the die corner portion a:

$$(r+x1)-(r+x2)=x1-x2 \qquad (1)$$

On the die corner portion b:

$$-[(r+x1')-(r+x2')]=x1'-x2' \qquad (2)$$

Here, the measuring marks arranged on the left of the Y-axis center line of the die or below the X-axis center line of the die are affixed with the symbol "−".

Where the misalignment distances x1 and x2' of the first patterns from the associated inner boxes on all the die corner portions a, b, c and d are the same, and the misalignment distances x1' and x2 of the second patterns from the associated inner boxes on all the die corner portions a, b, c and d are the same, the sum of the misalignment values at the die corner portions a and b calculated by the equations (1) and (2) becomes zero (that is, (x1−x2)+(x2'−x1')=0). This resultant value is an average X-axis misalignment offset value for normal upper die corner portions a and b.

Even when this value is zero, data values measured at two marks positioned at respective positions a and b may be non-zero where the pattern overlap is carried out while involving a die magnification. This is because the value of zero obtained in the above-mentioned manner is based only on the X-axis misalignment values of measuring marks.

Figure 6:
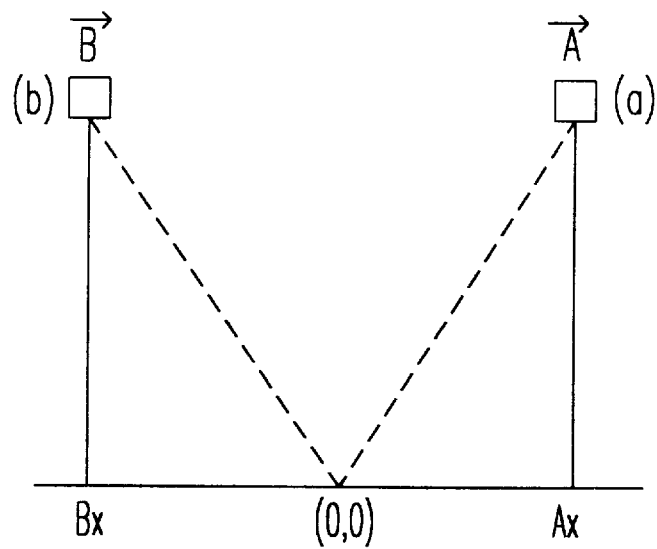
FIG. 6 is a schematic view illustrating X and Y-axis distances in the formation of magnification measuring marks in accordance with the present invention.

In the case of a die which has a center corresponding to an origin (0,0) and two measuring marks a and b having a magnification M while being respectively spaced from the origin by distances A and B, as shown in FIG. 6, it has an expanded magnification which corresponds to $M \cdot |\vec{A}|$ at the position and $M \cdot |\vec{B}|$ at the position b.

That is, where it is assumed that "M1" represents a die magnification at the measuring mark a in the formation of an element isolating pattern, and "M2" represents a die magnification at the measuring mark a in the formation of an gate electrode, an overlap, which is measured with reference to the center (0,0) of the die using a general overlap measuring device, is as follows:

On the measuring mark a:

$$(r+x1)-(r+x2) \rightarrow (r+M1 \cdot A \cdot k)-(r+M2 \cdot A \cdot k) \qquad (3)$$

On the measuring mark b:

$$(r+x2')-(r+x1') \rightarrow (r+M1 \cdot B \cdot k)-(r-M2 \cdot B \cdot k) \qquad (4)$$

Here, "r" represents a misalignment value of the inner box, and "k" is a distance between the inner and outer boxes. Typically, the distance k is 10 $\mu$m.

The sum $\delta$ of the measured values associated with the measuring marks a and b, namely, the resultant values of the equations (3) and (4), can be derived by the following equation:

$$\begin{aligned}\delta &= A \cdot k(M1 - M2) + B \cdot k(M1 - M2) \\ &= k(M1 - M2)(A + B)\end{aligned} \quad (5)$$

Accordingly, it is possible to easily derive a relative magnification value between patterns on the element isolating layer and gate electrode. This relative magnification value can be expressed by the following equation:

$$\delta/k(A+B)=M1-M2$$

When "M1" is set to "1", the following equation is derived from the above equation:;

$$M2=1-\delta/k(A+B) \quad (6)$$

Where "A" and "B" are the same, the follow equation is established:

$$\begin{aligned}XM2 &= 1 - \delta/2k \cdot |A|) \\ &= 1 - \delta/2k \cdot |B|)\end{aligned}$$

Here, "A" and "B" are distances from the die center (0,0) to the measuring marks disposed at the positions a and b, respectively. These values A and B are known values because they are design values used upon designing measuring marks. The value "XM2" is indicative of the X-axis magnification of the second pattern.

In the above-mentioned manner, the misalignment values δx and δy are easily calculated. Since such misalignment values are derived in association with all dies of a wafer and various positions of each die, they are useful for a magnification analysis.

It is also possible to derive X and Y-axis magnification values of the second pattern using the marks disposed at the positions a, b, c and d in the same manner as mentioned above.

The magnification of a desired target layer pattern can be derived by setting the magnification of the first or second pattern of the measuring mark, which is a standard layer pattern, as a reference magnification. That is, the following equation is established:

$$M_{target\ layer}=M_{standard\ layer}-\delta/k(A+B+C+D)$$

In other words, "δ" means the sum of the misalignment values δa, δb, δc and δd at respective positions a, b, c and d. These values are easily measured using a conventional measuring device. Since "A", "B", "C" and "D" are distances from the die origin (0,0) to respective mark positions a, b, c and d, the magnification of a desired target layer pattern can be easily derived in accordance with the above equation. This value may be used as an offset value in the fabrication of semiconductor devices.

Figure 7:
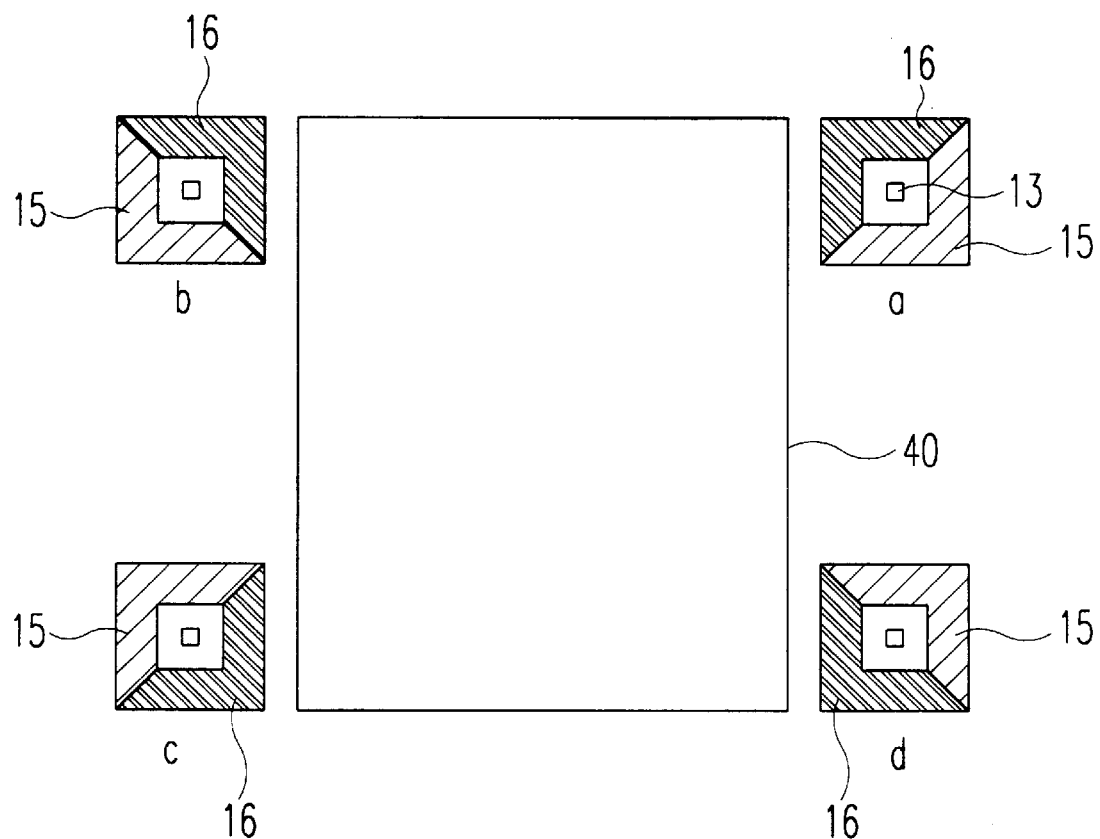
FIG. 7 is a plan view illustrating a magnification measuring mark according to another embodiment of the present invention.

FIG. 7 is a plan view illustrating a magnification measuring mark according to another embodiment of the present invention. As shown in FIG. 7, the magnification measuring mark has a square inner box 13 used as an alignment key in both X and Y axes and a square outer box disposed around the inner box 13. The outer box includes a first pattern 15 having an 180°-inverted L shape and a second pattern 16 having an L shape. The measuring mark is formed on each of four corner portions a, b, c and d of a die 40.

The first and second patterns 15 and 16 of four measuring marks are appropriately arranged on the die 40 so as to obtain an arrangement which is symmetrical in X and Y axes with respect to both the X and Y-axis center lines of the die 40.

In accordance with this embodiment of the present invention, it is possible to still maintain the structure of the conventional overlap measuring mark, for example, the site of 40×40 $\mu m^2$. It is also possible to use the measuring device for the pattern overlap in the same manner as in the conventional case. The lens distortion generated in steppers and the film stress generated on wafers result in a difference in the size between pattern layers which are formed at different processing times, respectively. In accordance with the present invention, it is possible to measure such a size difference, thereby correcting it.

As apparent from the above description, it is possible to easily measure a pattern magnification depending on a stepper and process used, on the basis of an easy and rapid magnification analysis according to the present invention. Accordingly, it is possible to easily evaluate the ability of the stepper used (in particular, the ability of the lens) and the processing ability of the semiconductor manufacturing process used. By virtue of a compensation of the magnification value, it is possible to reduce the process degradation rate while reducing the processing time. Accordingly, an improvement in yield is achieved.

The measuring mark of the present invention has different patterns disposed around an inner box in order to measure a magnification in both X and Y axes. As a result, it is possible to achieve an easy and rapid magnification measurement, as compared to conventional methods. In addition, an easy magnification analysis is obtained.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A magnification measuring mark structure for a semiconductor device including magnification measuring marks respectively arranged on scribe lines adjacent to the center of a die, each of the magnification measuring marks comprising:

an inner box arranged on each of four corner portions of the die where the scribe lines are disposed, respectively;

a first pattern arranged on each of the die corner portions in such a manner that it is disposed on the left or right of an associated one of the inner box, above the associated inner box or below the associated inner box, the first pattern being adapted to measure a misalignment in X and Y axes with reference to the inner box;

a second pattern arranged on each of the die corner portions in a region, where the first pattern is not disposed, in such a manner that it is disposed on the left or right of an associated one of the inner box, above the associated inner box or below the associated inner box, the first pattern being adapted to measure a misalignment in X and Y axes with reference to the inner box; and the first and second patterns being arranged in such a manner that they are symmetrical in X and Y axes along with those of other magnification measuring marks with respect to X and Y-axis center lines of the die, whereby one of the first and second patterns can be set as a reference pattern for measuring a magnification of the other pattern not set as the reference pattern.

2. The magnification measuring mark structure in accordance with claim 1, wherein each of the magnification measuring marks has a box-in-box structure.

3. The magnification measuring mark structure in accordance with claim 1, wherein one of the first and second patterns is comprised of a photoresist film pattern.

4. The magnification measuring mark structure in accordance with claim 1, wherein the measurement of the misalignment in X and Y axes using the first and second patterns is achieved by measuring distances from the inner box of each magnification measuring mark to the associated first and second patterns using a measuring device, respectively.

5. The magnification measuring mark structure in accordance with claim 1, wherein the X and Y-axis magnifications are derived by the following equation when the first pattern is set as a reference pattern:

$$M2=M1-\delta/k(A+B+C+D)$$

where, "A", "B", "C" and "D" represent design values which correspond to distances from the center of the die to respective positions of the magnification measuring marks, respectively, "M1" represents a magnification of the first pattern which is typically defined as "1", "M2" represents a magnification of the second pattern, and "$\delta$" represents the sum of X or Y-axis misalignment values at respective positions of the magnification measuring marks.

6. The magnification measuring mark structure in accordance with claim 1, wherein the X and Y-axis magnifications are derived by the following equation when the second pattern is set as a reference pattern:

$$M1=M2-\delta/k(A+B+C+D)$$

where, "A", "B", "C" and "D" represent design values which correspond to distances from the center of the die to respective positions of the magnification measuring marks, respectively, "M1" represents a magnification of the first pattern, "M2" represents a magnification of the second pattern which is typically defined as "1", and "$\delta$" represents the sum of X or Y-axis misalignment values at respective positions of the magnification measuring marks.

* * * * *